United States Patent
Hombach et al.

(10) Patent No.: US 6,587,677 B1
(45) Date of Patent: Jul. 1, 2003

(54) APPARATUS FOR MEASURING SPECIFIC ABSORPTION RATES

(75) Inventors: Volker Hombach, Dieburg (DE); Bernd Marx, Bensheim (DE); Thomas Loppnow, Reinheim (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/508,610

(22) PCT Filed: Jun. 16, 1999

(86) PCT No.: PCT/EP99/04144
§ 371 (c)(1),
(2), (4) Date: Mar. 14, 2000

(87) PCT Pub. No.: WO00/04399
PCT Pub. Date: Jan. 27, 2000

(30) Foreign Application Priority Data

Jul. 14, 1998 (DE) ............................................ 198 31 386

(51) Int. Cl.[7] ............................................... H04B 17/00
(52) U.S. Cl. ................................. 455/226.2; 455/226.4
(58) Field of Search .......................... 455/67.4, 226.1, 455/226.2, 226.4, 106, 6.7; 324/318–322

(56) References Cited

U.S. PATENT DOCUMENTS 6,181,136 B1 * 1/2001 Choi et al. .................. 324/318

FOREIGN PATENT DOCUMENTS

JP        07 092110      4/1995

OTHER PUBLICATIONS

Taakehiko Kobayashi et al. "Dry Phantom Composed of Ceramics and Its Application To SAR Estimation" IEEE Transactions on Microwave Theory and Techniques, Bd. 41, Nr. 1, Jan. 1, 1993, pp. 136–140, XP000358558, ISSN: 0018–9480*.

Yu et al. "Automated SAR Measurements For Compliance Testing of Cellular Telephones" Ieeeantennas and Propagation Society International Symposium, Online!, Bd. 4, Jun. 21–26, 1998, pp. 1980–1983, XP002118064, Atlanta ISBN: 0–7803–4478–2*.

Balzano Q et al., "Electromagnetic Energy Exposure of Simulated Users of Portale Cellular Telephones" IEEE Transactions on Vehicular Technology, Bd. 44, Nr. 3, Aug. 1, 1995, XP000526029*.

Hombach et al., "The Dependence of EM Energy Absorption Upon Human Headmodeling at 900 MHZ" IEEE Transactions on Microwave Theory and Techniques, Bd., 44, Nr. Oct. 10, 1996, XP002118065*.

* cited by examiner

Primary Examiner—Lee Nguyen
(74) Attorney, Agent, or Firm—Kenyon & Kenyon

(57) ABSTRACT

An apparatus for measuring the specific absorption rate (SAR) of a device (8) which generate electromagnetic fields. The apparatus includes a homogeneous solid spherical test phantom which has the average electrical properties of human tissue and at a defined distance from the surface contains a dipole probe which is positioned in such a way that the derived probe signal is proportional to the average SAR for 1 g or 10 g of tissue. The device to be tested, for example a mobile telephone, is guided past the surface of the phantom and turned until the instrument displays the maximum SAR value of the relevant limit.

8 Claims, 1 Drawing Sheet

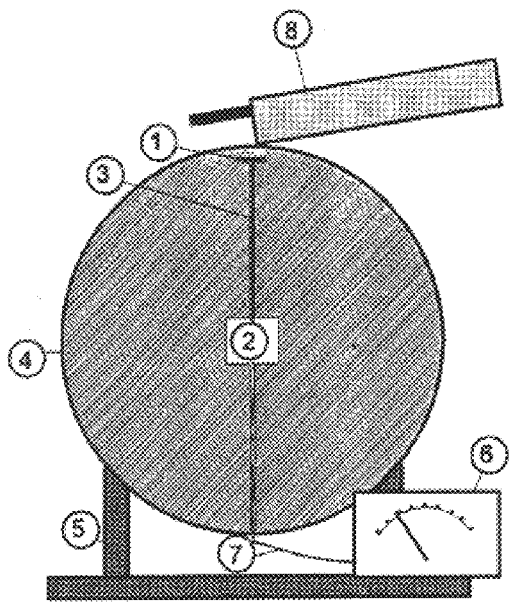 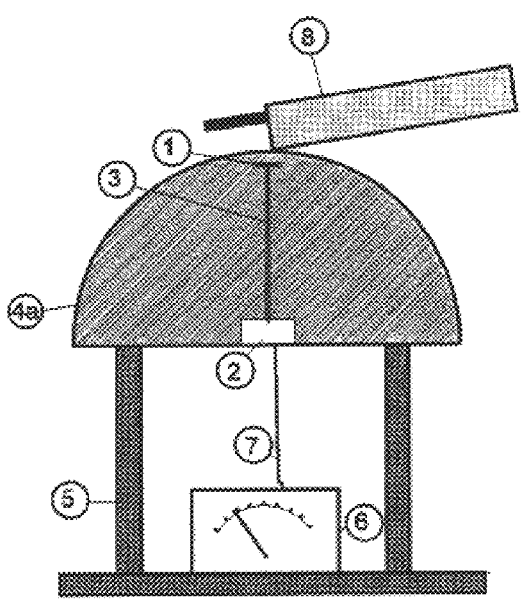
Fig. 1                    Fig. 2
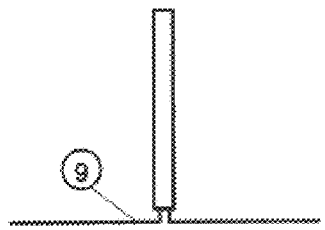
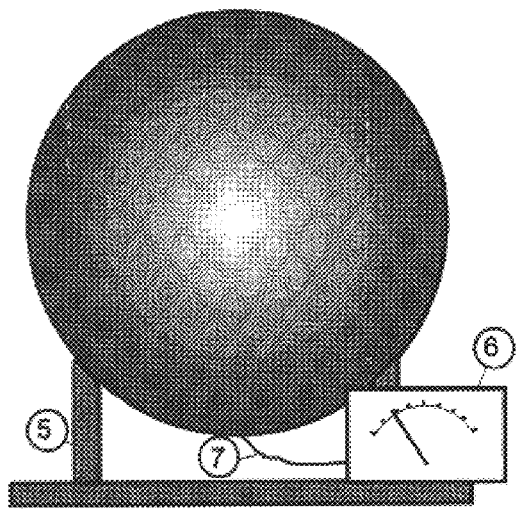 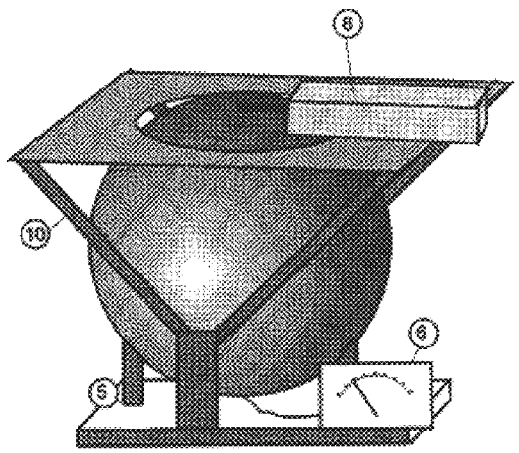
Fig. 3                    Fig. 4

APPARATUS FOR MEASURING SPECIFIC ABSORPTION RATES

FIELD OF THE INVENTION

Modem industrial society employs a multiplicity of devices which produce electromagnetic fields. To protect the health of humans, national and international standards and laws stipulate maximum limit values for such fields which must not be exceeded. In this context, the basic measured variable used to quantify electromagnetic exposure in a high-frequency field is the specific absorption rate (SAR). It indicates the energy per mass unit absorbed in the tissue. In the case of near-field exposure, such as the kind that occurs, for example, when portable cellular telephones are used, the SAR limit values relate to the maximum absorption occurring in the human body, averaged over 1 g or 10 g of tissue mass. The SAR distribution in a person can be determined by numerical simulation calculations or by measurements made using electrical field probes in phantom models. The main advantage one derives from measurements, as compared to calculations, is the ability to simply and reliably ascertain differences and variances between individual devices that produce electromagnetic fields.

Since it is not possible to measure SAR values directly in a living organism, phantom models of the human body or of body parts, such as the head, are used, which reflect real conditions fairly well. A measuring station frequently used nowadays to determine the SAR values produced in the human head by portable cellular telephones is described by Q. Balzano, O. Garay and T. J. Manning in "Electromagnetic Energy Exposure of Simulated Users of Portable Cellular Telephones", IEEE Transactions on Vehicular Technology, vol. 44, no. 3, August 1995, pp. 390–403. It describes externally attaching the portable cellular telephone being tested to a phantom model simulating the form of the human head. The phantom model is made of a thin plastic shell and is filled with a liquid that simulates tissue. An electrical field probe is moved within this liquid with the aid of a computer-controlled industrial robot. In the process, the computer records the electrical field strength values or SAR values over a three-dimensional grid network in the phantom model and, from the individual values, calculates the SAR values, averaged over 1 g or 10 g tissue mass, which are relevant to limit values. Apart from the undoubted advantages associated with a measuring station of this kind, there are various drawbacks with respect to systematic serial tests and development tests:

a) Substantial investment and operational costs are entailed in using an industrial robot including three-dimensional control.
  b) The time needed to complete one measuring run at one single position of the portable cellular telephone is 30 minutes or longer. It usually takes several measuring runs to determine the least favorable position having the highest SAR value.
  c) Moving the probe inside the phantom requires filling the phantom with a liquid. Since, over time, the liquid evaporates and its electrical properties change, one must constantly monitor the parameters of the liquid.

SUMMARY OF THE INVENTION

It is an object of the present invention to overcome the disadvantages of the known measuring station in qualifying devices which produce electromagnetic high-frequency fields.

In the measuring apparatus according to the present invention, the electrical field probe is not moved inside the phantom model, but is in a defined, fixed position, preferably 5 to 9 mm below the surface. This eliminates the need for mechanical movement, or for control and evaluation thereof. Instead, the device to be tested (e.g., a portable cellular telephone) is moved by hand or using a simple moving mechanism, past the outside surface of the phantom, it also being possible to determine the influence of the hand.

Simple mechanical auxiliary devices made of non-conducting plastic can be used to set the positions (e.g., those specified in a standard) of the device being tested. Through specific trials, one can establish the position in which the indicated specific absorption rate is at its maximum, with little outlay and within an extremely short period of time.

The present invention employs a phantom model of a solid material made, for example, of a combination of synthetic resin, ceramic powder and graphite powder. T. Kobayashi et al. reveal in "Dry Phantom Composed of Ceramics and Its Application to SAR Estimation", IEEE Transactions on Microwave Theory and Techniques, vol. 41, no. 1, January 1993, pp. 136–140 that solid materials are also suited for simulating the electrical properties of human tissues. As will be explained in the following, precise compliance with the tissue parameters is only of minor importance with regard to the measuring accuracy of the apparatus according to the present invention. The solid phantom model is non-toxic, simple to use, and does not change its properties over time.

Since the probe is in a fixed location in the loss-encumbered phantom, the outlay required to derive the detected signal is considerably less than that entailed when using highly complex probes, as required in liquid phantoms. The probe signal merely needs to be amplified using a simple electronic circuit and fed to a display instrument which produces the time-averaged value.

BRIEF DESCRIPTION OF THE DRAWING

The measuring apparatus according to the present invention is described with reference to the drawings, in which:

FIG. 1 is a cross-sectional view of a measuring apparatus according to the present invention;

FIG. 2 shows a further exemplary embodiment, including a hemispherical phantom;

FIG. 3 shows a schematic representation of the calibration of a measuring apparatus according to the present invention; and FIG. 4 shows a perspective view of an apparatus according to the present invention with an auxiliary device for the defined positioning of portable cellular telephones.

DETAILED DESCRIPTION

As shown in FIG. 1, a measuring apparatus according to the present invention is made of a sphere 4 having a diameter of between 180 and 200 mm. The material of the sphere is solid and has approximately the average electrical properties of human tissue (e.g. at 900 MHz the values: relative dielectric constant=42, specific conductivity=0.9 S/m). The sphere is held by a stand 5 made of non-conducting material. To measure the SAR value averaged over 1 g, a dipole probe 1 having an overall length of approx. 8 mm is positioned at a distance of 5 mm below the surface of the sphere. To measure the SAR value averaged over 10 g, the distance of the probe from the surface of the sphere must be around 9 mm. The high-frequency signal received from the dipole probe is rectified by a detector diode and is transmitted via a low pass filter and a high-resistance line 3 to evaluation electronics 2 in the center of the sphere. The evaluation electronics delivers a DC voltage, which is proportional to the measured local SAR value and is supplied via a line 7 to the analog or digital display instrument 6. The power supply for the evaluation electronics may be accommodated either in the sphere or on the outside. Test device 8, which may be a portable cellular telephone, is moved past the surface of the sphere, it being possible for the SAR value averaged over 1 g or 10 g to be read off directly on the display instrument. Thus, one can very easily establish, inter alia, the position having the maximum read-out.

Since in the loss-encumbered phantom sphere, in the exposure situation of relevance here, the polarization of the electric field strength near the surface is virtually parallel to the surface, it suffices to employ one dipole probe having suitably disposed dipole arms. By rotating the test device, the polarization alignment having the maximum reading is then initially to be determined. To be independent of the polarization alignment of the device antenna, it is also possible to install two dipoles, disposed perpendicularly to each other and each parallel to the surface, the signals from the dipoles being summed in the evaluation electronics.

The substantial shielding and absorption effect of the phantom material makes it possible for the measuring apparatus to also be constructed merely of a hemisphere 4a, as shown in FIG. 2. Providing information in terms of standards on the absolute value of the specific absorption rate requires calibrating the measuring apparatus prior to use. FIG. 3 illustrates one simple, yet reliable calibration method. A transmitting dipole 9 having the overall length of half of a wavelength is positioned at a distance of between 10 and 50 mm above the sphere and is supplied with a defined power. The reading indicated in this context is compared to the reading determined from a simulation calculation using the same geometrical configuration and the same transmitting power. Since simulation calculations using the method of finite differences in time, the method of finite elements, or the method of moments deliver verifiable and reliable results for such simple geometries, it is possible, in such a calibration of the overall arrangement, to compensate for various error influences resulting from inaccuracies in the manufacture of the phantom sphere (e.g., with regard to the electrical parameters of the material and the positioning of the probe). Preferably the necessary calibration factors are directly incorporated in the evaluation electronics, to obtain an instrument indication which is simple to read.

Specific standards-compliant measurements require a defined positioning of the portable cellular telephone that is being assessed. To reproducibly set such a positioning, one can attach an auxiliary device 10 made of non-conducting plastic, according to FIG. 4, for example. The auxiliary apparatus must be provided with appropriate markings and be movable in a plurality of axes.

With regard to the extent to which the SAR values established with the measuring apparatus according to the invention favorably compare with the SAR values actually occurring in a human, the following considerations should be noted:

a) As is demonstrated by detailed simulation tests, the SAR values produced in different human heads by the same portable cellular telephone exhibit a certain variation range which is attributable to the individual external head shapes, different inhomogeneous tissue distributions, and divergent tissue parameters. Consequently, there is not one standard SAR value which can be assigned to a portable cellular telephone.

b) Both simulation calculations and also measurements prove that, if the dielectric constant and conductivity of a homogeneous head model are appropriately chosen, the SAR values averaged over 1 g or 10 g, as produced in the near field by a portable cellular telephone, are higher than or equal to the SAR values of an inhomogeneous head model. Therefore, when oriented to the limit values for human safety, the SAR values established with homogeneous models are on the safe side.

c) In the case of homogeneous phantoms, the electromagnetic absorption is dependent on the surface contour or radius of curvature. In the case of near-field exposure, the maximum local SAR value averaged over 1 g or 10 g rises only very little for radii of curvature over one fourth of a wavelength. Consequently, a sphere having a diameter of between 180 and 200 mm effectively represents the relevant radii of curvature of human heads and yields SAR values which tend rather to be too high, than too low.

What is claimed is:

1. An apparatus for measuring a specific absorption rate caused in a head phantom by a device which produces electromagnetic fields, the apparatus comprising:

a homogeneous spherical phantom model including a solid material having average electrical properties of human tissue; and an electrical field probe including evaluation electronics, the electrical field probe being disposed in the phantom model so as to enable the specific absorption rate over a defined mass to be directly read off at an associated display instrument in response to an approach of the device which produces electromagnetic fields to the phantom model.

2. The apparatus as recited in claim 1 wherein the device which produces electromagnetic fields includes a portable cellular telephone.

3. The apparatus as recited in claim 1 wherein the phantom model includes a spherical section.

4. The apparatus as recited in claim 3 wherein the spherical section includes a hemisphere.

5. The apparatus as recited in claim 1 further comprising at least one auxiliary device disposed externally to the phantom model for enabling the device which produces electromagnetic fields to be reproducibly set in at least one predefined position, the at least one auxiliary device including a non-conducting plastic.

6. The apparatus as recited in claim 1 wherein the electrical field probe includes an electrical dipole.

7. The apparatus as recited in claim 1 wherein the electrical field probe includes two dipoles disposed orthogonally with respect to each other.

8. The apparatus as recited in claim 1 wherein the display instrument is specially calibrated.

* * * * *